United States Patent [19]

Jobe

[11] Patent Number: 4,691,384
[45] Date of Patent: Sep. 1, 1987

[54] INTRINSICALLY SAFE MULTI-DROP COMMUNICATIONS LINK

[75] Inventor: Tommy L. Jobe, Noble, Okla.

[73] Assignee: Technical Oil Tools Corporation, Norman, Okla.

[21] Appl. No.: 782,888

[22] Filed: Oct. 2, 1985

[51] Int. Cl.⁴ .............................................. H03H 5/12
[52] U.S. Cl. ............................. 455/602; 307/200 A; 361/100; 455/607; 455/617
[58] Field of Search ............... 455/600, 602, 607, 617; 304/870.01, 870.11; 307/200 A; 328/8; 361/10, 100; 364/131, 132; 370/90; 679/2 C; 375/36; 379/412

[56] References Cited

U.S. PATENT DOCUMENTS

| | | |
|---|---|---|
| 3,373,291 | 3/1968 | Peterson et al. ................ 307/200 A |
| 3,454,790 | 7/1969 | Rockwell ......................... 307/200 A |
| 4,228,323 | 10/1980 | Feiner ................................... 455/602 |
| 4,306,803 | 12/1981 | Donohue et al. .................... 364/131 |
| 4,340,922 | 7/1982 | Delaporte et al. ................... 361/100 |
| 4,547,855 | 10/1985 | Lanyi et al. ........................ 364/132 |

*Primary Examiner*—Benedict V. Safourek
*Attorney, Agent, or Firm*—Norvell & Associates

[57] ABSTRACT

A multi-drop communication link, consisting of a master and a plurality of slaves is intrinsically safe for use in a hazardous environment. Slaves are in parallel and communicate with the master through transmit and receive shunt-diode safety barriers. An opto-coupler interface is provided between each slave and the transmit and receive circuits communicating with the master. The opto-couplers comprise infrared emitter-detector pairs which can be spaced apart by an intrinsically safe distance.

12 Claims, 4 Drawing Figures

BARRIERED MULTIDROP LINK

CONVENTIONAL MULTIDROP COMMUNICATIONS

INTRINSICALLY SAFE MULTI-DROP COMMUNICATIONS LINK

BACKGROUND OF THE INVENTION

1. Field of the Invention

This invention relates to a multi-drop communications link including a master and a plurality of slave devices in which potential fault or spark conditions are avoided to render the communications link intrinsically safe for use in hazardous locations such as at the surface of an oil or gas well.

2. Description of the Prior Art

Multi-drop communication links between a master and a pluarlity of slave devices as depicted in FIG. 1. For example, a master device such as a mini computer can be interconnected with a plurality of non-intelligent or slave devices, such as printers or other display output, by transmit and receive lines. Such conventional multi-drop communication links are not, however, suitable for use in a hazardous location requiring intrinsically safe circuit. An intrinsically safe circuit has been defined by Underwriters Laboratory, Inc. in UL Standard 913 as a circuit in which any spark or thermal effect, produced normally or in specified fault conditions, is incapable in the test conditions prescribed in this Standard of causing ignition of a mixture of flammable or combustible material in the air in its most easily ignited concentration. That same Standard defines an intrinsically safe apparatus as an apparatus in which any spark or thermal effect produced either normally or in specified fault conditions, is incapable, under test conditions prescribed in this Standard, of causing ignition of a mixture of flammable or combustible material in air in its most easily ignitable concentration. The energy inflamable in a hazardous location must not be capable of igniting a hazardous atmosphere mixture due to arcing or temperature during normal operations. Normal operations includes opening, shorting and grounding of field wiring of an intrinsically safe circuit. A fault is defined as a defect or electrical breakdown of any component, spacing, or insulation either alone or in combination with other faults may adversly affect the electrical or thermal characteristics of the intrinsically safe circuit. If a defect or breakdown leads to defects or breakdowns in other components, the primary and subsequent defects and breakdowns are considered to be a single fault.

The most common method of insuring intrinsic safety is through the use of a fuse-protected shunt-diode safety barrier, which is defined as a network consisting of a series fuse, voltage-limiting shunt-diodes, and a current-limiting resistor designed to limit current and voltage. The fuse protects the diodes from open-circuiting in a high fault current condition.

Reliance upon safety barriers alone to provide an intrinsically safe multi-drop link would require the use of safety barriers as shown in FIG. 2. Such a barrier multi-drop link would require the use of a barrier on each transmit line leading from each component in the multi-drop loop and a barrier on each receive line leading from each component in the multi-drop loop. Thus, two barriers would be required for each component, master and slave, for a multi-drop loop. This barrier multi-drop approach is, however, severely limited in a current loop application because the potential across each barrier associated with the transmit side of the master, and thus the power required to the slaves, is additive. Therefore, the number of safety barriers which can be used in a hazardous enviroment is limited. Therefore, the use of conventional safety barriers alone limits the number of components which can be used in a hazardous location if intrinsic safety is to be maintained.

The instant invention relies not only upon conventional safety barriers, but provides adequate clearance distances for components within the communications link to define an intrinsically safe circuit for use in a hazardous environment. This is especially important in providing a multi-drop communication link which can be used at the surface of a subterranean oil or gas well. For example, operators of offshore drilling rigs require that intrinsic safety be maintained on these offshore rigs since any potential blowout or fire can result in significant loss. Any electrical system used to monitor drilling activity and the condition of the well bore must therefore be intrinsically safe.

SUMMARY OF THE INVENTION

An intrinsically safe multi-drop communications link which can be used in a hazardous environment such as the surface of an oil and gas well comprises a master and a plurality of slaves. Such a multi-drop link could include a mini computer as the master and a plurality of non-intelligent devices acting as slaves in a polled multi-drop link. Slaves would be in parallel with transmit lines extending from the master output to the slaves and receive lines running from each slave to the master input. Safety barriers would be used at the master output and input to prevent any spark condition from the intrinsically safe mini computer apparatus. An opto-coupler interface or opto-isolators would be employed at each slave, between the slave and the transmit and receive lines, extending from the master to the slave. The opto-coupler interface comprises an emitter-detector pair which are spaced apart by an intrinsically safe distance. Thus, fault conditions cannot occur at the slave devices, and the number of safety barriers is sufficiently low that the current potential across the multiple safety barriers does not result in a fault condition inconsistent with intrinsic safety.

DETAILED DESCRIPTION OF THE PREFERRED EMBODIMENT

Figure 2:
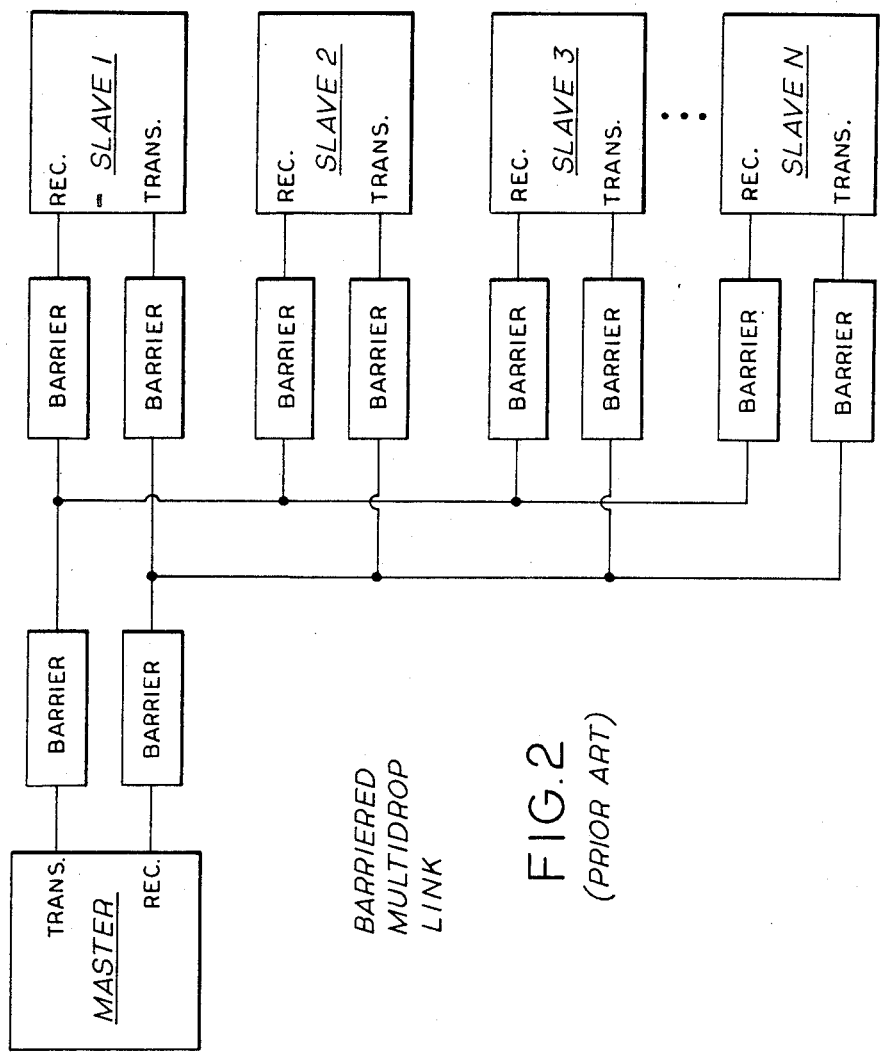
FIG. 2 is a circuit diagram showing a prior art barrier multi-drop communications link.
Figure 1:
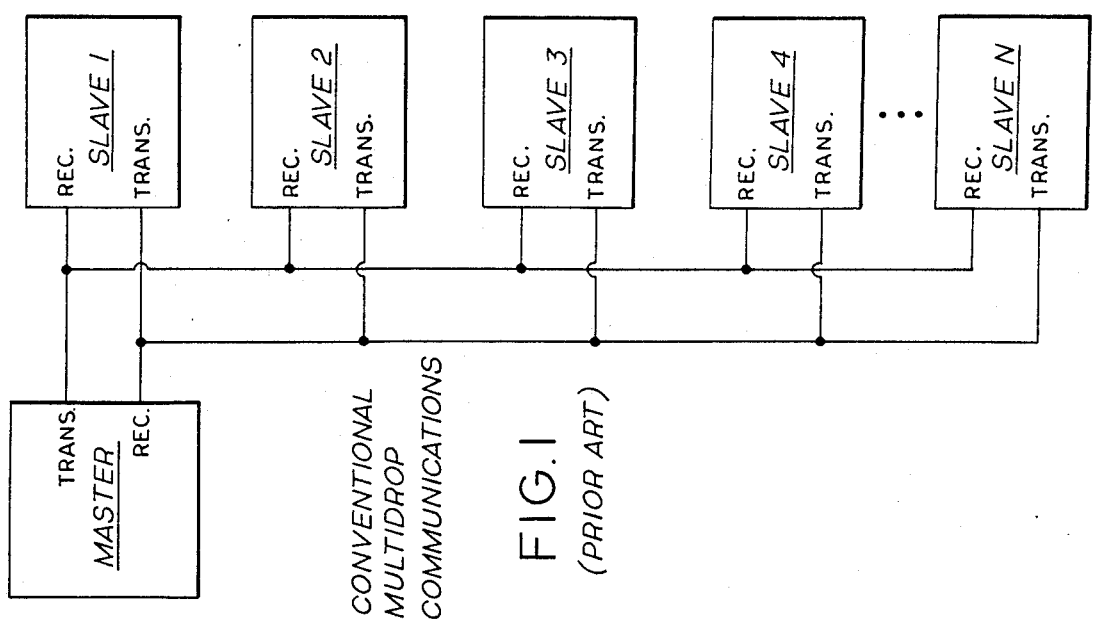
FIG. 1 is a circuit diagram showning a conventional prior art, non-intrinsically safe multi-drop communications link.
Figure 3:
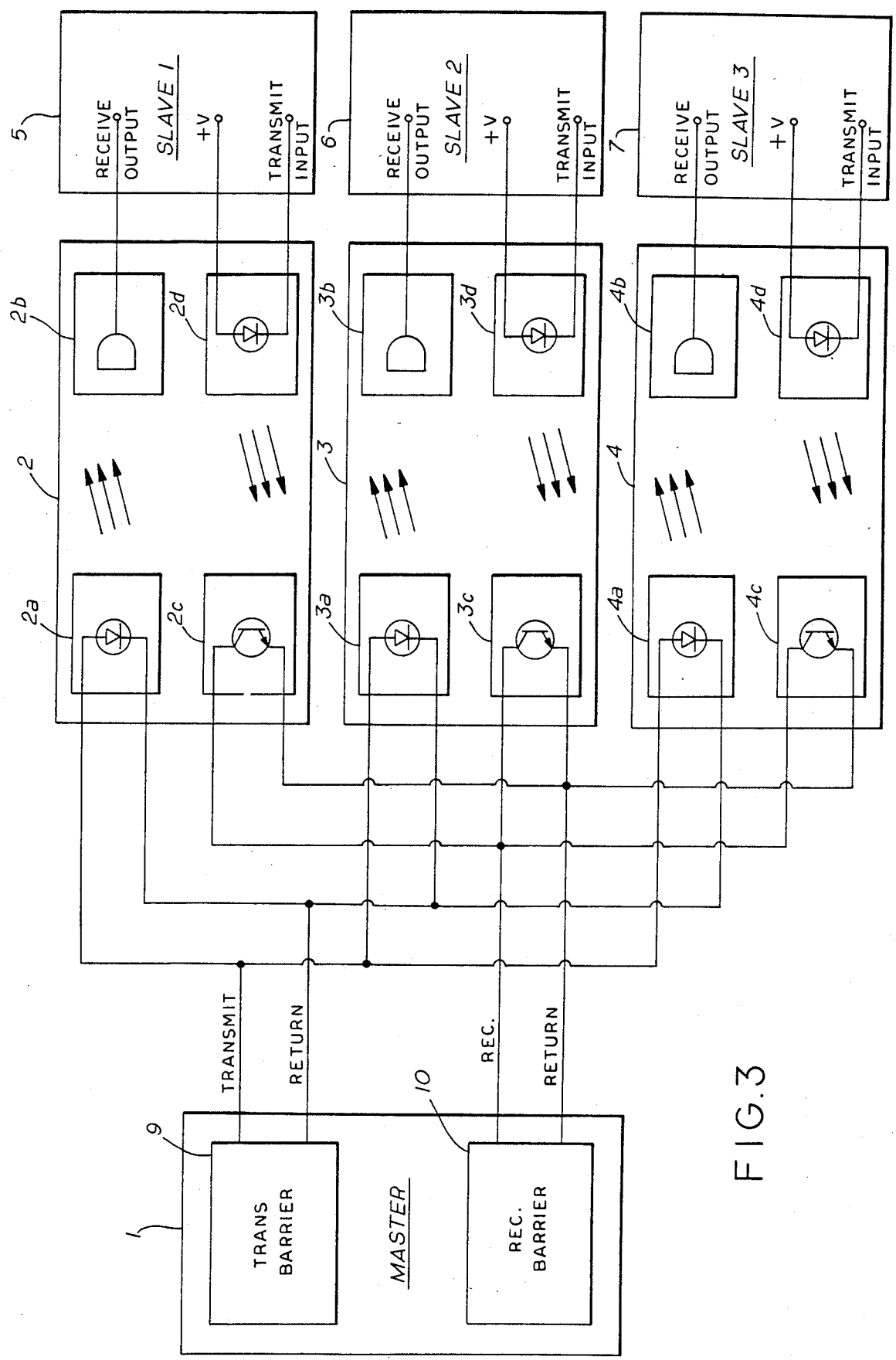
FIG. 3 is a circuit diagram depicting and intrinsically safe multi-drop communications link employing only two safety barriers.

The optically isolated, intrinsically safe multi-drop communications link shown in FIG. 3 comprises a master 1 communicating with a plurality of slaves 5, 6, and 7 through intermediate opto-couplers 2, 3, and 4. The master can comprise an intelligent device such as a minicomputer or microprocessor communicating between a plurality of non-intelligent slaves. For example, each of the slaves could be an output device such as a printer located at positions on an oil and gas well. Information from the minicomputer 1 transmitted to each of the output devices 5, 6, and 7 located within the same hazardous environment would be allowed only through an intrinsically safe circuit. In the preferred embodiment of this invention, conventional fuse-protected, shunt-diodes safety barriers 9 and 10 are employed between the internal circuitry of the master element 1 and the external intrinsically safe circuit communicating with slave devices 5, 6, and 7. These safety barriers limit the voltage and the current which can be communicated between the internal circuitry of the master 1 and the external multi-drop communications link. Therefore, any fault condition which might occur within the master 1 would not be communicated to the external multi-drop communications circuit. These transmit and receive barriers 9 and 10 comprise, in the preferred embodiment of this invention, fuse-protected shunt-diode safety barriers.

Figure 4:
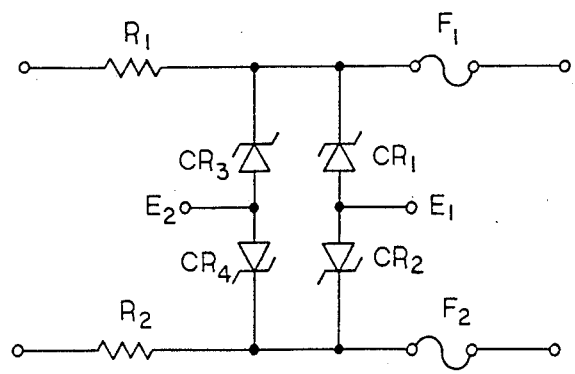
FIG. 4 is a circuit diagram showing the construction of a conventional shut-diode safety barrier.

FIG. 4 is a circuit diagram of a conventional shunt-diode safety barrier. A simple, dual safety barrier circuit would consist of series fuses F1 and F2, voltage-limiting shunt-diodes CR1, CR2, CR3, and CR4, and current-limiting resistors R1 and R2. The shunt-diode safety barrier shown in FIG. 4 comprises a conventional, two-channel safety barrier ideal for use with two wire systems. Thes conventional safety barriers let measurement or control signals pass without loss, but in the event of an electrical fault, limit the voltage and current entering a hazardous location from the master 1.

As shown in FIG. 3, each of the transmit and return lines lead to the master input and output at the transmit barriers and receive barriers and are connected to opto-coupler interfaces 2, 3, and 4 associated with separate slave devices 5, 6, and 7, respectively. Each opto-coupler or isolater comprises an emitter-detector pair. For example, the opto-coupler interfaces 2 for slave 1 employs an emitter 2a in series in the transmitter return lines extending from transmit barrier 9 at the master output to the opto-coupler interface 2. In the preferred embodiment of this invention, the emitter 2a comprises a conventional infrared-emitting diode. The infrared energy from diode 2a is detected by a conventional photo transistor 2b. Thus, any signal transmitted from the output of master 1 to slave 5 would be converted into infrared energy by conventional emmiter 2a. This infrared energy would be detected by photo detector 2b and converted into an electrical signal or transmission to the corresponding slave shown schematically and identified by the numeral 5. Any return signal transmitting from slave 1 would be input to a similar conventional infrared-emitting diode 2d. The emitted infrared energy would be detected by second transistor detector 2c and returned to the received circuit to the input of master 1 through the receive barrier 10. The emitter-detector pair 2a, 2b, and 2c, 2d can be spaced apart by a distance sufficient to insure intrinsic safety of the circuit. For example, the emitter and detector can be placed apart by a distance at least equal to three millimeters for a DC or peak AC vlotage of 60 volts of for a AC RMS voltage of 42.2 volts.

The opto-couplers 2, 3, and 4 do not relaease energies which are additive as with a safety barriers, and thus, a much greater number of slave devices can be connected to a single master in parallel as shown in FIG. 3. Polled multi-drop communications loops such as those which can be required for use at the surface of a well bore, especially on an offshore rig, to monitor the progress of drilling or production from a well can therefore be used in a hazardous environment containing not only a master but also a plurality of slaves, all in the same area.

Although the invention has been described in terms of specified embodiment which is set forth in detail, it should be understood that this is by illustration only and that the invention is not necessarily limited thereto, since alternative embodiments and operating techniques will become apparent to those skilled in the art in view of the disclosure. Accordingly, modifications are contemplated which can be made without departing from the spirit of the described invention.

What is claimed and desired to be secured by Letters Patent is:

1. An intrinsically safe multi-drop communications link between a master and a plurality of slaves, comprising:
   a transmit line extending from the master and toward each slave;
   a receive line extending from the master and toward each slave;
   voltage-limiting means and current-limiting means between the master and the transmit and receive lines; and
   opto-coupler interfaces respectively between each slave and the transmit and receive lines, each opto-coupler interface comprising an emmitter-detector pair spaced apart by an intrinsically safe distance, whereby intrinsically unsafe conditions cannot occur.

2. The multi-drop communications link o claim 1, wherein the emitter and detector of each of the emitter-detector pairs communicate by infrared signals.

3. The multi-drop communications link of claim 1, wherein the emitter and detector of each of the emitter-detector pairs are separated by air, and the minimum spacing between the emitter and detector is three (3) millimeters.

4. An intrinsically safe multi-drop communications link comprising a master having an output and an input means and a plurality of slaves, the slaves being in parallel; a transmit line extending from the master output means toward each slave; a receive line extending from each slave toward the master input means; a first shunt-diode safety barrier circuit in the master output means and a second shunt-diode safety barrier circuit in the master input means; and an opto-coupler interface at each slave communicating between each slave and the transmit and receive lines extending thereto, the opto-coupler interface comprising emitter-detector pairs spaced apart by an intrinsically safe distance whereby intrinsically unsafe fault conditions cannot occur.

5. The multi-drop communications link of claim 4 wherein the emitter-detector pairs are separated by air.

6. The multi-drop communications link of claim 5 wherein the emitter and detector communicate by infrared signals.

7. The multi-drop communications link of claim 6 wherein the minimum spacing between the emitter and detector is three (3) millimeters, for a peak DC or AC voltage of 60 volts on an AC RMS voltage of 42.4 volts.

8. The multi-drop communications link of claim 4 comprising a polled multi-drop communications links.

9. The multi-drop communications link of claim 4 wherein the master comprises a computer.

10. An intrinsically safe multi-drop communications link for use in the presence of potentially flammable hydrocarbon vapors produced from a subterranean oil or gas well bore; comprising:

a master computer located in the potential presence of the hydrocarbon vapors;

a plurality of slave devices each located in the potential presence of the hydrocarbon vapors;

a master output and a master input;

a first shunt-diode safety barrier circuit at the master output and a second shunt-diode safety barrier circuit at the master input;

a transmit line and a receive line extending from the master computer toward each slave device and communicable respectively with the master computer through the first and second shunt-diode safety barrier circuits; and an opto-coupler interface at each slave device communicating between each slave device and the transmit and receive lines extendig thereto, each opto-coupler interface comprising emitter-detector pairs spaced apart by an intrinsically safe distance whereby intrinsically unsafe fault conditions cannot occur in the multi-drop communications link.

11. The multi-drop communications link of claim 10 wherein the emitter and detector of each of the emitter-detector pairs communicate by infrared signals.

12. The multi-drop communications link of claim 10 wherein the emitter and detector of each of the emitter-detector pairs are separated by air, and the minimum spacing between the emitter and detector is three (3) millimeters.

* * * * *